US010700217B2

(12) United States Patent
Izumi

(10) Patent No.: US 10,700,217 B2
(45) Date of Patent: Jun. 30, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Masato Izumi, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/234,657

(22) Filed: Dec. 28, 2018

(65) Prior Publication Data

US 2020/0066920 A1 Feb. 27, 2020

(30) Foreign Application Priority Data

Aug. 21, 2018 (JP) ................................ 2018-154593

(51) Int. Cl.

*H01L 29/868* (2006.01)
*H01L 29/06* (2006.01)
*H01L 29/872* (2006.01)

(52) U.S. Cl.

CPC ........ *H01L 29/868* (2013.01); *H01L 29/0615* (2013.01); *H01L 29/0619* (2013.01); *H01L 29/872* (2013.01)

(58) Field of Classification Search

CPC ............... H01L 29/868; H01L 29/0615; H01L 29/0619; H01L 29/872; H01L 29/66143; H01L 29/861

See application file for complete search history.

(56) References Cited

U.S. PATENT DOCUMENTS 6,054,748 A 4/2000 Tsukuda et al.
6,501,146 B1 12/2002 Harada
2014/0084337 A1* 3/2014 Matsudai ................ H01L 29/36 257/140

FOREIGN PATENT DOCUMENTS

JP 11-274516 10/1999
JP 3618517 2/2005
JP 4167313 10/2008

* cited by examiner

*Primary Examiner* — Changhyun Yi

(74) *Attorney, Agent, or Firm* — Oblon, McClelland, Maier & Neustadt, L.L.P.

(57) ABSTRACT

A semiconductor device includes second and third semiconductor layers provided on a first semiconductor layer. The second semiconductor layer includes a recess portion and an outer edge portion. The third semiconductor layer is away from the second semiconductor layer in a first direction along a first boundary between the first semiconductor layer and the recess portion. The second semiconductor layer has first and second distributions of a second conductivity type impurity at a vicinity of the first boundary and at a vicinity of a second boundary between the outer edge portion and the first semiconductor layer, respectively. The third semiconductor layer has a third distribution of a second conductivity type impurity at a vicinity of a third boundary between the first semiconductor layer and the third semiconductor layer. The first distribution is substantially same as the second distribution. The third distribution is substantially same as the second distribution.

18 Claims, 9 Drawing Sheets

9
70 33 45 75
85
31 31
60
87
40
30
20
10
50
Z
Y X

SEMICONDUCTOR DEVICE

CROSS-REFERENCE TO RELATED APPLICATIONS

This application is based upon and claims the benefit of priority from Japanese Patent Application No. 2018-154593, filed on Aug. 21, 2018; the entire contents of which are incorporated herein by reference.

FIELD

Embodiments relate to a semiconductor device.

BACKGROUND

A semiconductor device used in power control includes, for example, a P-type semiconductor layer, an N-type semiconductor layer, and a low-concentration layer, i.e., a so-called intrinsic layer (I-layer) or drift layer. The low-concentration layer has a low impurity concentration, and is disposed between the P-type semiconductor layer and the N-type semiconductor layer. In the semiconductor device having such a structure, when the amount of holes injected into the low-concentration layer from the P-type semiconductor layer is high, the ON-resistance is lower; but the switching speed from the ON-state to the OFF-state is slower. Accordingly, to reduce the ON-resistance and increase the switching speed, it is important to adequately control the injection amount of the holes into the low-concentration layer.

DETAILED DESCRIPTION

Figure 1:
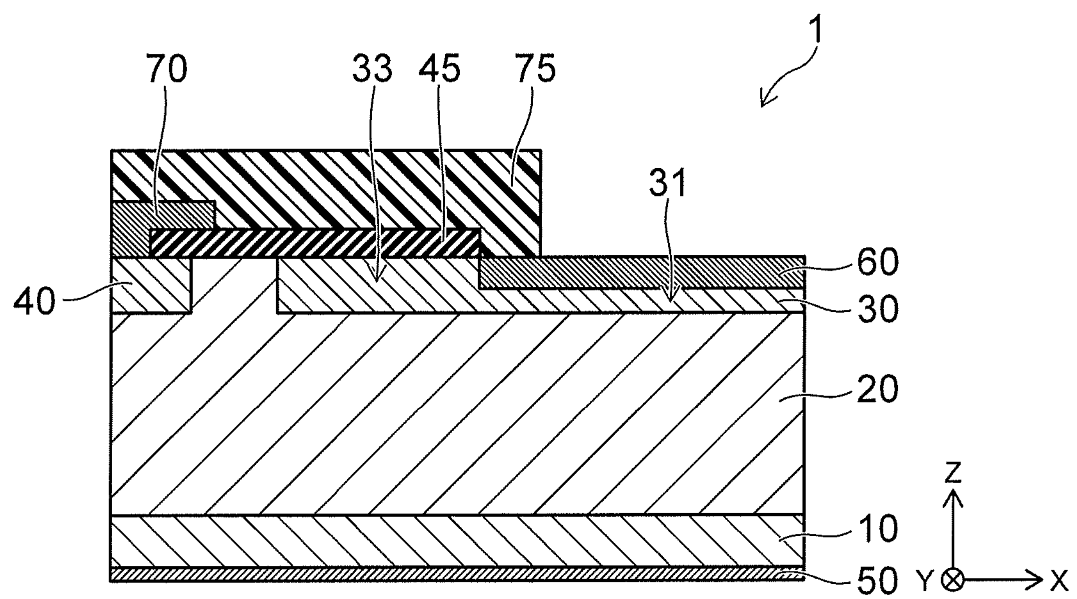
FIG. 1 is a schematic cross-sectional view showing a semiconductor device according to a first embodiment.

According to one embodiment, a semiconductor device includes a first semiconductor layer of a first conductivity type, a second semiconductor layer of a second conductivity type and a third semiconductor layer of a second conductivity type. The second semiconductor layer is provided on the first semiconductor layer. The second semiconductor layer includes a recess portion and an outer edge portion, the recess portion being provided inside the second semiconductor layer, the outer edge portion surrounding the recess portion. The third semiconductor layer is provided on the first semiconductor layer. The third semiconductor layer is disposed to be away from the second semiconductor layer in a first direction directed along a first boundary between the first semiconductor layer and the recess portion of the second semiconductor layer. The second semiconductor layer has a first distribution of a second conductivity type impurity at a vicinity of the first boundary and a second distribution of a second conductivity type impurity at a vicinity of a second boundary between the outer edge portion of the second semiconductor layer and the first semiconductor layer. The first and second distributions are defined in a second direction crossing the first boundary, and the first distribution is substantially same as the second distribution. The third semiconductor layer has a third distribution of a second conductivity type impurity at a vicinity of a third boundary between the first semiconductor layer and the third semiconductor layer. The third distribution is defined in the second direction, and is substantially same as the second distribution.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

First Embodiment

FIG. 1 is a schematic cross-sectional view showing a semiconductor device 1 according to a first embodiment.

Figure 2:
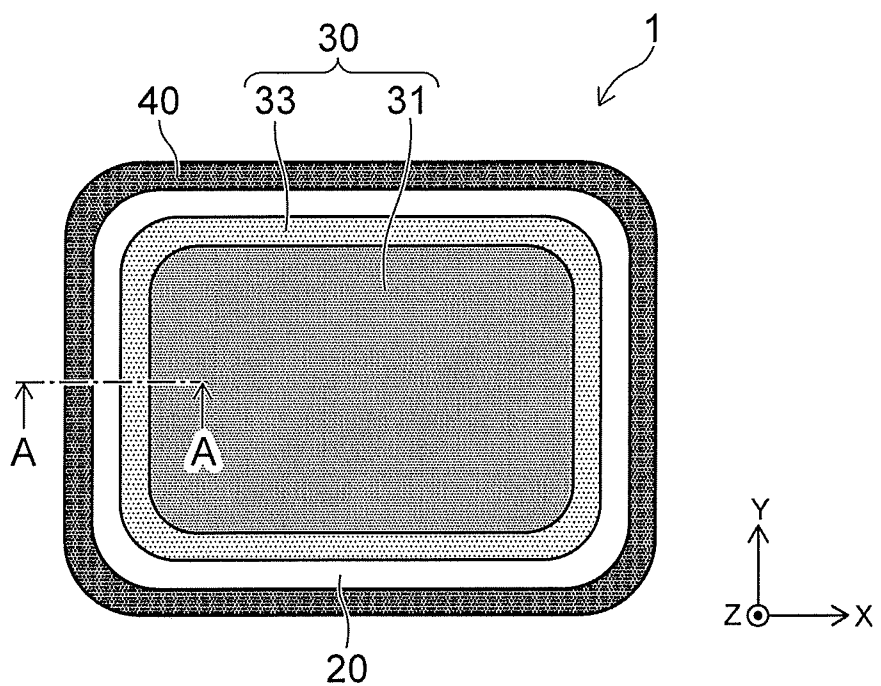
FIG. 2 is a schematic plan view showing the semiconductor device according to the first embodiment.

FIG. 2 is a schematic plan view showing the semiconductor device 1 according to the first embodiment. FIG. 1 is a schematic view showing a cross section along line A-A shown in FIG. 2.

The semiconductor device 1 is, for example, a Fast Recovery Diode (FRD).

As shown in FIG. 1, the semiconductor device 1 includes an N-type cathode layer 10, an I-layer 20, and a P-type anode layer 30. The I-layer 20 is provided between the N-type cathode layer 10 and the P-type anode layer 30. The I-layer 20 is, for example, an N-type semiconductor layer including an N-type impurity having a lower concentration than that of the N-type cathode layer 10.

The N-type cathode layer 10 is, for example, an N-type silicon substrate. The I-layer 20 is, for example, an N-type silicon layer epitaxially grown on the N-type silicon substrate. The P-type anode layer 30 is, for example, a P-type diffusion layer formed selectively in the N-type silicon layer.

The P-type anode layer 30 includes a recess portion 31 and an outer edge portion 33. The recess portion 31 is a portion of the P-type anode layer 30 having a thickness in the Z-direction that is thinner than that of the outer edge portion 33 (this is similar hereinbelow). The recess portion 31 is formed by selectively removing a portion of the P-type anode layer 30. The thickness in the Z-direction of the recess portion 31 is thinner than the thickness in the Z-direction of the outer edge portion 33. As shown in FIG. 2, for example, the outer edge portion 33 is disposed to surround the recess portion 31.

The semiconductor device 1 further includes a guard ring layer 40. The guard ring layer 40 is, for example, a P-type semiconductor layer and is formed simultaneously with the P-type anode layer 30. Also, the guard ring layer 40 is provided to be separated from the P-type anode layer 30 in a direction (e.g., the X-direction and/or the Y-direction) along the boundary between the I-layer 20 and the recess portion 31. As shown in FIG. 2, the guard ring layer 40 is provided to surround the P-type anode layer 30.

The semiconductor device 1 further includes a cathode electrode 50, an anode electrode 60, and a guard ring electrode 70. The cathode electrode 50 is provided on the backside of the N-type cathode layer 10 and is connected to the N-type cathode layer 10. For example, the anode electrode 60 is provided on the recess portion 31 and is connected to the P-type anode layer 30. The guard ring electrode 70 is connected to the guard ring layer 40.

The semiconductor device 1 further includes an insulating film 45 and a passivation film 75.

The insulating film 45 is provided to cover the outer edge portion 33 of the P-type anode layer 30, the inner edge of the guard ring layer 40, and the I-layer 20 exposed between the P-type anode layer 30 and the guard ring layer 40. The insulating film 45 is, for example, a silicon oxide film. The passivation film 75 is provided to cover the guard ring electrode 70, the insulating film 45, and a portion of the anode electrode 60. The passivation film 75 is, for example, an insulative resin film.

Figure 3A:
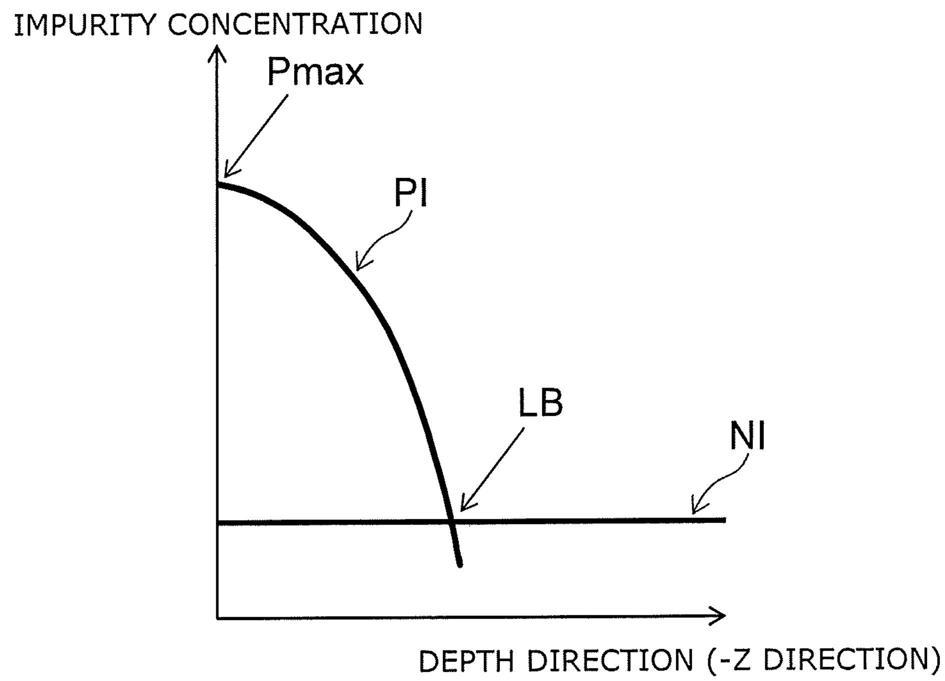
FIGS. 3A and 3B are schematic views showing impurity distributions of the semiconductor device according to the first embodiment.
Figure 3B:
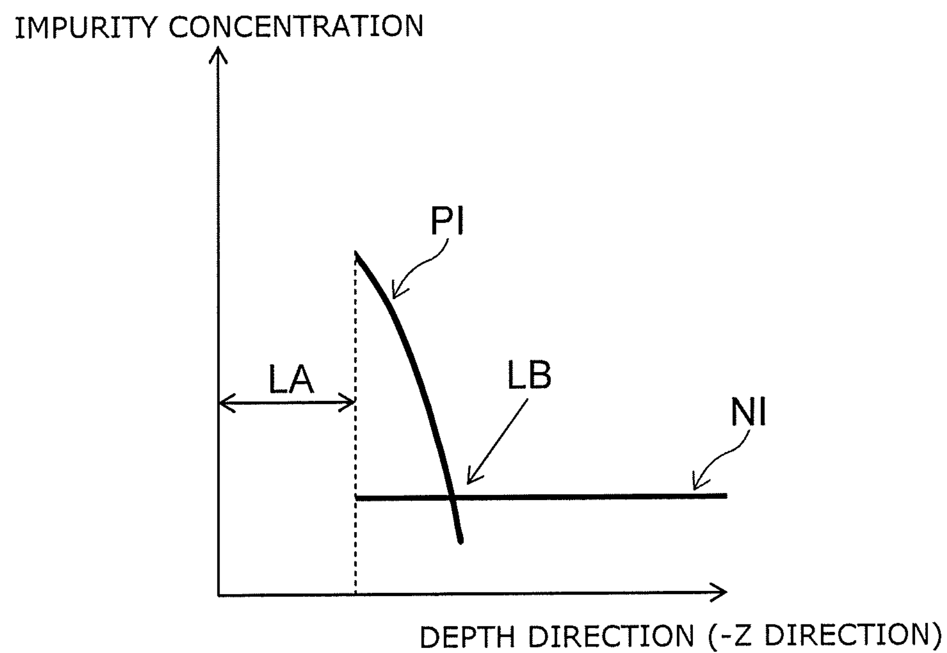

FIGS. 3A and 3B are schematic views showing impurity distributions of the semiconductor device 1 according to the first embodiment. FIG. 3A is a schematic view showing the impurity distributions of the outer edge portion 33 of the P-type anode layer 30 and the guard ring layer 40. FIG. 3B is a schematic view showing the impurity distribution of the recess portion 31 of the P-type anode layer 30.

“NI” and “PI” shown in FIGS. 3A and 3B respectively illustrate the concentration distributions of the N-type impurity and the P-type impurity. “LB” shows the boundary between the I-layer 20 and the P-type anode layer 30 or the boundary between the I-layer 20 and the guard ring layer 40.

The P-type anode layer 30 and the guard ring layer 40 are formed simultaneously. For example, the P-type anode layer 30 and the guard ring layer 40 are formed by selectively performing ion implantation of the P-type impurity into a silicon layer and subsequently causing diffusion by heat treatment. Accordingly, the P-type anode layer 30 and the guard ring layer 40 are formed so that the P-type impurity distributions in the depth direction (the −Z direction) are substantially the same.

A peak concentration Pmax of the P-type impurity shown in FIG. 3A is, for example, $1\times10^{18}$ $cm^{-3}$ or more. The concentration of the N-type impurity of the I-layer 20 is, for example, $1\times10^{17}$ $cm^{-3}$ or less.

As shown in FIG. 3B, the recess portion 31 is formed by selectively removing (recessing) a portion of the P-type anode layer 30. In the recess portion 31, the high-concentration region of the P-type impurity of the P-type anode layer 30 is removed; but the distribution of the P-type impurity at the boundary vicinity between the I-layer 20 and the P-type anode layer 30 is maintained.

In other words, the P-type impurity distribution of the recess portion 31 at the boundary vicinity between the I-layer 20 and the P-type anode layer 30 is substantially the same as the P-type impurity distribution of the outer edge portion 33 at the boundary vicinity between the I-layer 20 and the P-type anode layer 30. Also, the P-type impurity distribution of the recess portion 31 at the boundary vicinity between the I-layer 20 and the P-type anode layer 30 is substantially the same P-type impurity distribution at the boundary vicinity between the I-layer 20 and the guard ring layer 40.

The amount of the P-type impurity in the recess portion 31 is dependent on the depth in the −Z direction (hereinbelow, a recess amount LA) from the level of the upper surface of the outer edge portion 33 to the upper surface of the recess portion 31. For example, the amount of the P-type impurity is reduced by increasing the recess amount LA; and the amount of the P-type impurity is increased by reducing the recess amount LA. In other words, the amount of holes injected into the I-layer 20 from the P-type anode layer 30 when the semiconductor device 1 is biased in the forward direction can be controlled using the recess amount LA.

By controlling the recess amount LA in the embodiment, the hole injection amount from the P-type anode layer 30 into the I-layer 20 can be set favorably; and it is possible to optimize the ON-resistance and the switching speed to match the application of the semiconductor device 1.

In the semiconductor device 1, it is also possible to increase the breakdown immunity of the outer perimeter portion of the P-type anode layer 30, i.e., the so-called terminal portion. For example, it is favorable for the terminal portion to maintain an immunity that can block a current that is 2 to 3 times the rated current. The breakdown modes at such a current level include a mode in which the material melts due to the Joule heat, and a mode of breakdown due to electric field concentration. Conversely, it is possible to increase the breakdown immunity of the terminal portion by causing the depth and/or the profile to be uniform for the P-type diffusion layer including the outer edge portion 33 of the P-type anode layer 30 and the guard ring layer 40.

In the embodiment, substantially the same P-type impurity distribution can be obtained for the outer edge portion 33 and the guard ring layer 40 by simultaneously forming the P-type anode layer 30 and the guard ring layer 40. Also, in the outer edge portion 33 and the guard ring layer 40, compared to the recess portion 31, the profile of the P-type diffusion layer is maintained to be thick in the −Z direction. Thereby, the breakdown immunity in the terminal region of the semiconductor device 1 can be increased. In other words, in the semiconductor device 1, it is possible to optimize the ON-resistance and the switching speed while ensuring the breakdown immunity of the semiconductor device 1.

Figure 4:
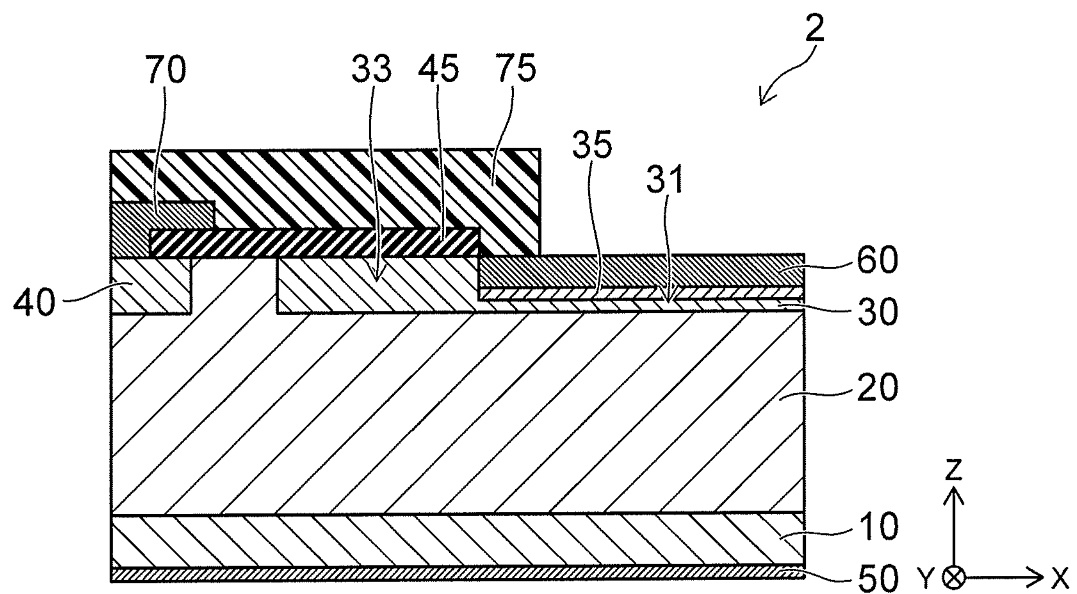
FIG. 4 is a schematic cross-sectional view showing a semiconductor device according to a first modification of the first embodiment.

FIG. 4 is a schematic cross-sectional view showing a semiconductor device 2 according to a first modification of the first embodiment. The semiconductor device 2 has the planar arrangement of the P-type anode layer 30 and the guard ring layer 40 shown in FIG. 2. FIG. 4 is a schematic view illustrating the cross section along line A-A shown in FIG. 2.

As shown in FIG. 4, the semiconductor device 2 further includes a P-type contact layer 35. The P-type contact layer 35 is provided between the recess portion 31 of the P-type anode layer 30 and the anode electrode 60. The P-type contact layer 35 includes a P-type impurity having a higher concentration than the peak concentration of the P-type impurity in the recess portion 31 (referring to FIG. 3B). Thereby, for example, an ohmic contact can be formed between the P-type contact layer 35 and the anode electrode 60.

For example, the P-type contact layer 35 is formed by ion implantation of the P-type impurity into the surface layer of the recess portion 31. At this time, the implantation energy is set to be low to obtain a distribution of the P-type impurity having a high peak concentration for a low dose. Further, the P-type impurity is activated by heat treatment for a short length of time. Thereby, the diffusion of the P-type impurity can be suppressed; and the P-type contact layer 35 can be formed to be shallow. For example, the P-type contact layer 35 is formed so that the thickness in the Z-direction is thinner than the thickness in the Z-direction of the recess portion 31.

Such a P-type contact layer 35 is formed to include a high concentration of the P-type impurity without drastically increasing the P-type impurity amount between the I-layer 20 and the anode electrode 60. In the example as well, it is possible to correct the hole injection amount from the P-type anode layer 30 into the I-layer 20 by controlling the recess amount LA.

Figure 5:
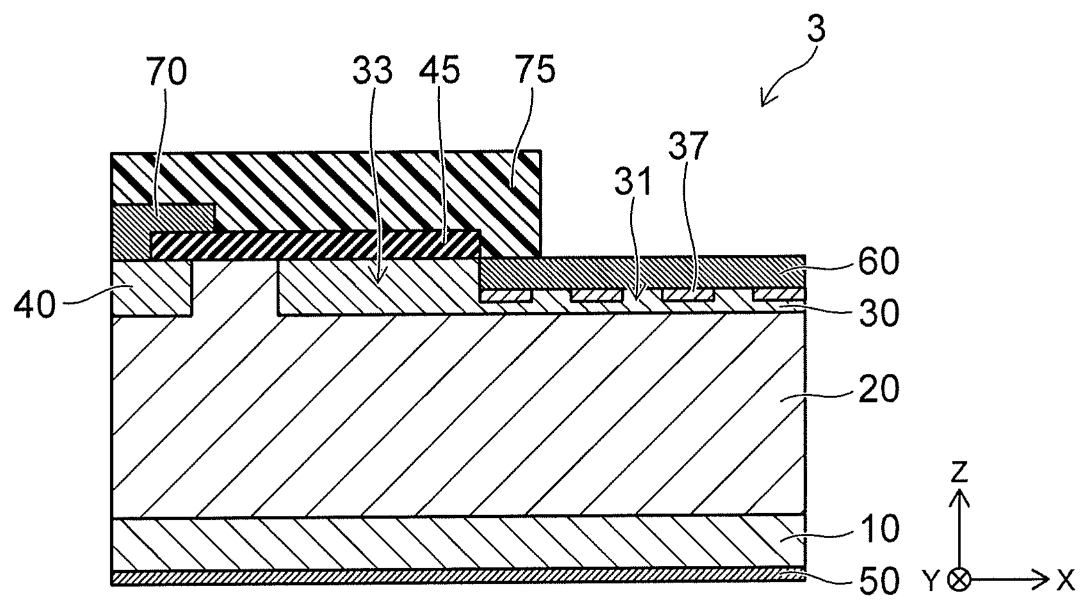
FIG. 5 is a schematic cross-sectional view showing a semiconductor device 3 according to a second modification of the first embodiment.

FIG. 5 is a schematic cross-sectional view showing a semiconductor device 3 according to a second modification of the first embodiment. The semiconductor device 3 has the planar arrangement of the P-type anode layer 30 and the guard ring layer 40 shown in FIG. 2. FIG. 5 is a schematic view illustrating the cross section along line A-A shown in FIG. 2.

As shown in FIG. 5, the semiconductor device 3 includes a P-type contact layer 37. The P-type contact layer 37 is provided between the recess portion 31 of the P-type anode layer 30 and the anode electrode 60. The P-type contact layer 37 is formed to include multiple regions separated from each other. For example, the P-type contact layer 37 is formed using the same method as the P-type contact layer 35 (referring to FIG. 4) and includes the P-type impurity having a higher concentration than the peak concentration of the P-type impurity in the recess portion 31 (referring to FIG. 3B). For example, the P-type contact layer 37 is formed so that the thickness in the Z-direction is thinner than the thickness in the Z-direction of the recess portion 31.

In the semiconductor device 3, by forming the P-type contact layer 37 to include the multiple regions separated from each other, the increase of the P-type impurity amount between the I-layer 20 and the anode electrode 60 can be suppressed compared to the semiconductor device 2. In the example as well, an ohmic contact can be formed between the P-type contact layer 37 and the anode electrode 60. Also, it is possible to correct the hole injection amount from the P-type anode layer 30 into the I-layer 20 by controlling the recess amount LA.

Figure 6:
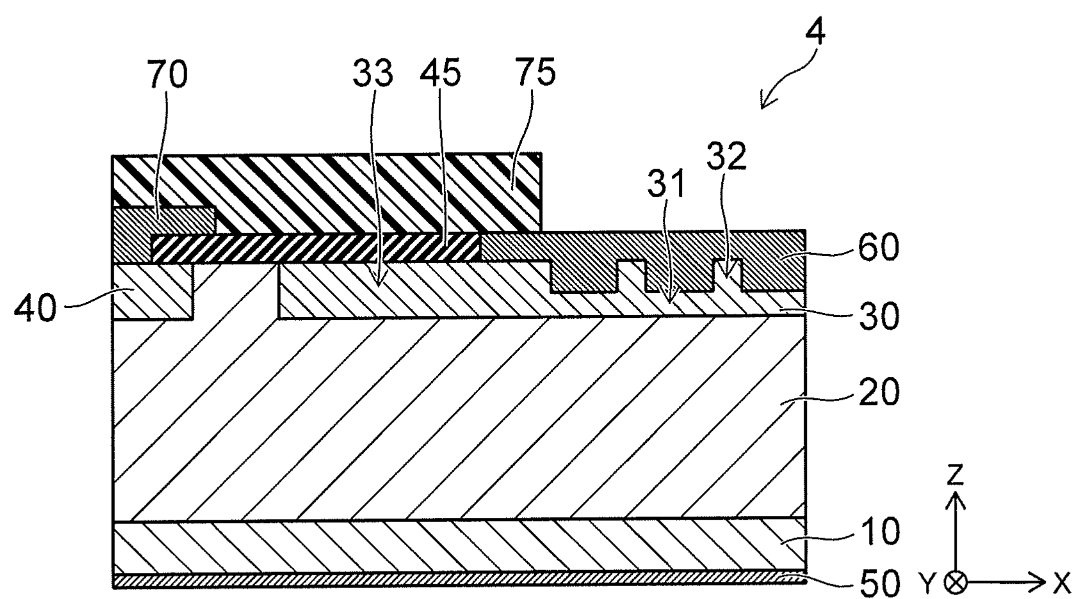
FIG. 6 is a schematic cross-sectional view showing a semiconductor device 4 according to a third modification of the first embodiment.
Figure 7A:
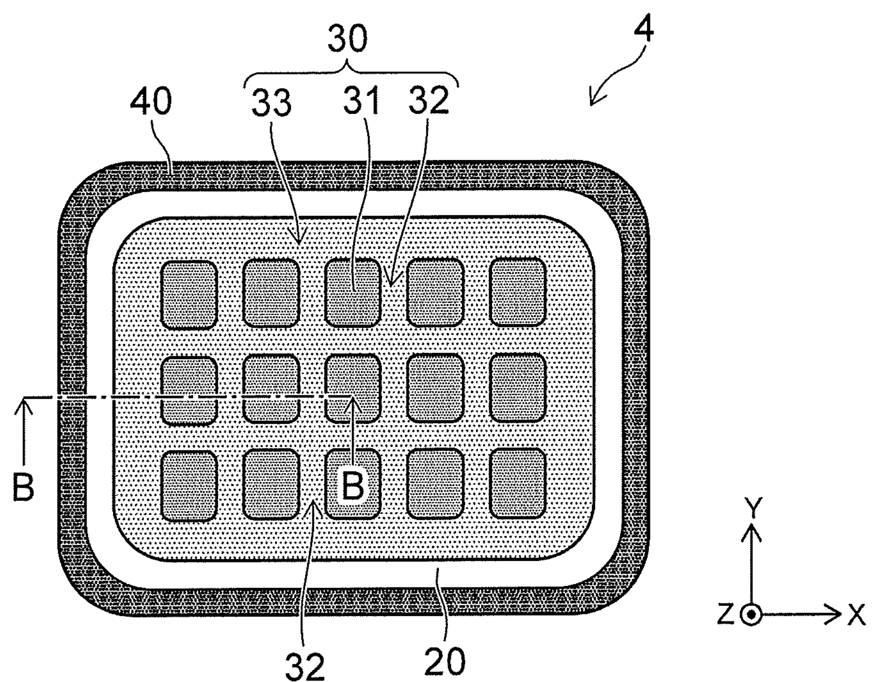
FIGS. 7A and 7B are schematic plan views showing the semiconductor device according to the third modification of the first embodiment.
Figure 7B:
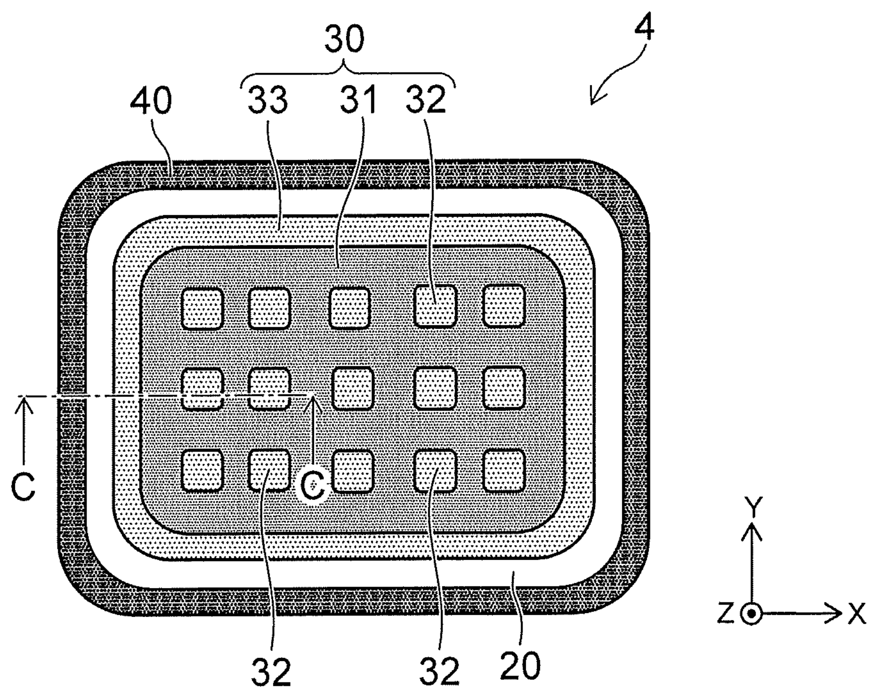

FIG. 6, FIG. 7A, and FIG. 7B are schematic views showing a semiconductor device 4 according to a third modification of the first embodiment. FIG. 6 is a schematic view illustrating a cross section along line B-B shown in FIG. 7A or along line C-C shown in FIG. 7B. FIG. 7A and FIG. 7B are schematic plan views showing arrangements of the P-type anode layer 30 and the guard ring layer 40 of the semiconductor device 4.

As shown in FIG. 6, the P-type anode layer 30 of the semiconductor device 4 includes the recess portion 31, a protrusion 32, and the outer edge portion 33. The recess portion 31 is formed by selectively removing a portion of the P-type anode layer 30. The protrusion 32 remains between the regions where the P-type anode layer 30 is selectively removed.

As shown in FIG. 7A, the multiple recess portions 31 are formed in the P-type anode layer 30. The protrusion 32 remains between the mutually-adjacent recess portions 31. Also, the outer edge portion 33 is provided to surround the recess portions 31 and the protrusion 32.

As shown in FIG. 7B, the semiconductor device 4 may have a configuration in which the multiple protrusions 32 remain in island configurations in the interior of the recess portion 31 formed in the P-type anode layer 30.

As shown in FIG. 6, the anode electrode 60 of the semiconductor device 4 is provided to cover the recess portion 31 and the protrusion 32. The anode electrode 60 contacts the recess portion 31 and the protrusion 32. For example, the protrusion 32 has the distribution of the P-type impurity shown in FIG. 3A. Accordingly, in the semiconductor device 4, an ohmic contact can be obtained between the anode electrode 60 and the upper surface of the protrusion 32.

In the example, in addition to the recess amount LA of the recess portion 31 (referring to FIG. 3B), the amount of holes injected into the I-layer 20 from the P-type anode layer 30 can be corrected by controlling the surface area ratio of the recess portion 31 and the protrusion 32.

Figure 8:
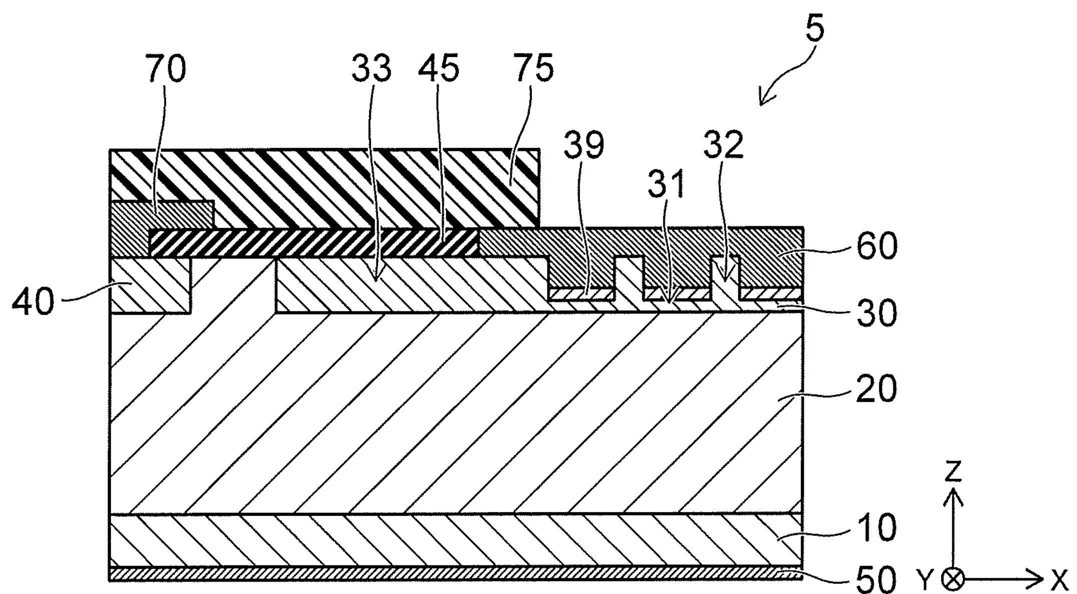
FIG. 8 is a schematic cross-sectional view showing a semiconductor device according to a fourth modification of the first embodiment.

FIG. 8 is a schematic cross-sectional view showing a semiconductor device 5 according to a fourth modification of the first embodiment. The semiconductor device 5 has the planar arrangement of the P-type anode layer 30 and the guard ring layer 40 shown in FIG. 7A or 7B. FIG. 8 is a schematic view illustrating the cross section along line B-B shown in FIG. 7A or along line C-C shown in FIG. 7B.

As shown in FIG. 8, the semiconductor device 5 further includes a P-type contact layer 39. The P-type contact layer 39 is provided between the recess portion 31 of the P-type anode layer 30 and the anode electrode 60. The P-type contact layer 39 includes the P-type impurity having a higher concentration than the peak concentration of the P-type impurity in the recess portion 31 (referring to FIG. 3B). Thereby, in addition to the upper surface of the protrusion 32, an ohmic contact can be formed between the P-type contact layer 39 and the anode electrode 60. The P-type contact layer 39 is formed so that the thickness in the Z-direction is thinner than the thickness in the Z-direction of the recess portion 31 so that the P-type impurity amount between the I-layer 20 and the anode electrode 60 does not increase drastically.

Second Embodiment

Figure 9:
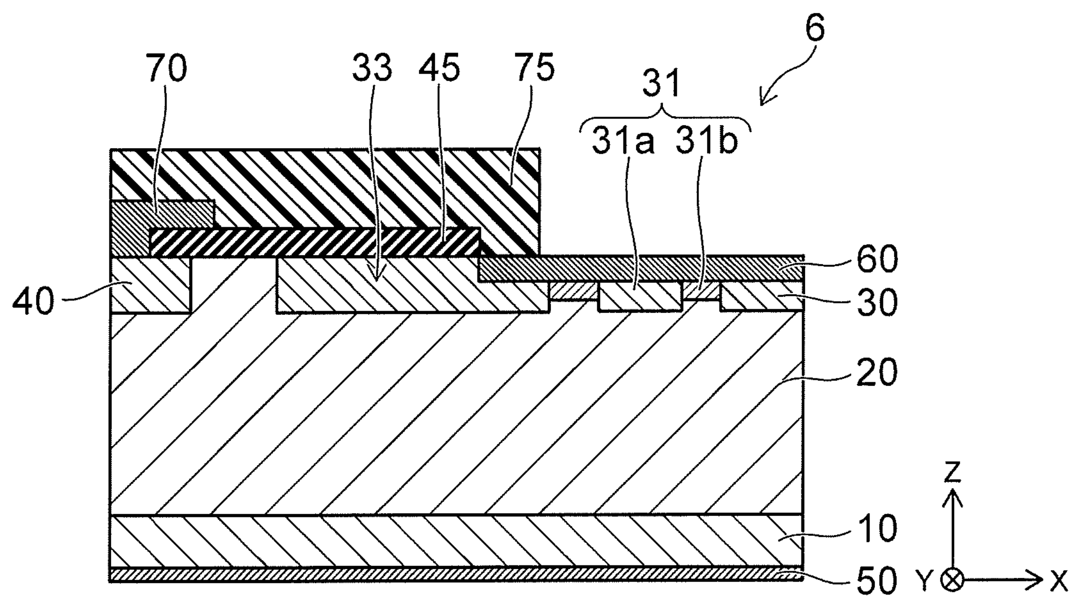
FIG. 9 is a schematic cross-sectional view showing a semiconductor device according to a second embodiment.
Figure 10:
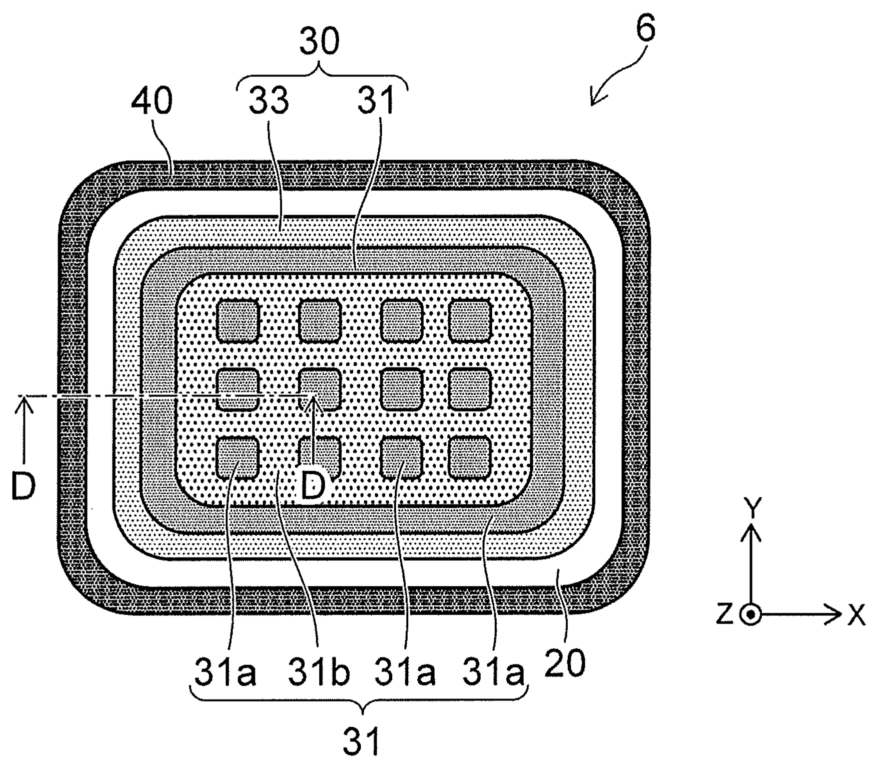
FIG. 10 is a schematic plan view showing the semiconductor device according to the second embodiment.

FIG. 9 and FIG. 10 are schematic views showing a semiconductor device 6 according to a second embodiment.

FIG. 9 is a schematic view illustrating a cross section along line D-D shown in FIG. 10. FIG. 10 is a schematic plan view showing the arrangement of the P-type anode layer 30 and the guard ring layer 40 of the semiconductor device 6.

As shown in FIG. 9 and FIG. 10, the P-type anode layer 30 of the semiconductor device 6 includes the recess portion 31 and the outer edge portion 33. The recess portion 31 includes a first region 31*a* and a second region 31*b*. The first region 31*a* includes the P-type impurity having a higher concentration than that of the second region 31*b*.

In the embodiment as well, the outer edge portion 33 of the P-type anode layer 30 and the guard ring layer 40 have the P-type impurity distribution shown in FIG. 3A. Conversely, the first region 31*a* has the P-type impurity distribution shown in FIG. 3B. The P-type impurity distribution in the Z-direction at the boundary vicinity between the first region 31*a* and the I-layer 20 is substantially the same as the P-type impurity distribution in the Z-direction at the boundary vicinity between the outer edge portion 33 and the I-layer 20.

The second region 31*b* has a P-type impurity distribution having a lower concentration than the P-type impurity distribution shown in FIG. 3B. Thereby, in the semiconductor device 6, for example, the amount of holes injected into the I-layer 20 from the P-type anode layer 30 also can be suppressed more than in the semiconductor device 1. Also, by controlling the recess amount LA of the recess portion 31 (referring to FIG. 3B), the amount of holes injected into the I-layer 20 can be corrected in a wider range.

For example, the P-type anode layer 30 is formed by selectively performing ion implantation of the P-type impurity into the N-type semiconductor layer having the low impurity concentration used to form the I-layer 20 and by subsequently diffusing the P-type impurity by heat treatment. The dose of the P-type impurity implanted into the portions used to form the first region 31*a* and the outer edge portion 33 is set to be more than the dose of the P-type impurity implanted into the portion used to form the second region 31*b*. In the embodiment as well, the guard ring layer 40 is formed simultaneously with the P-type anode layer 30. In the P-type anode layer 30, a portion of the P-type diffusion layer is selectively removed after diffusing the P-type impurity.

Figure 11:
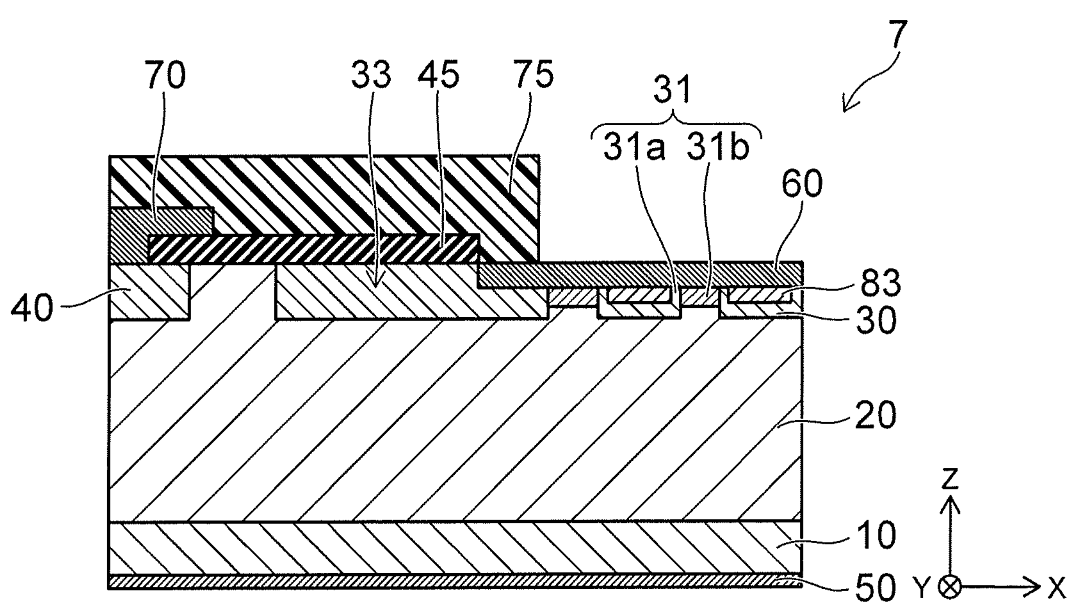
FIG. 11 is a schematic cross-sectional view showing a semiconductor device according to a first modification of the second embodiment.

FIG. 11 is a schematic cross-sectional view showing a semiconductor device 7 according to a first modification of the second embodiment. The semiconductor device 7 has the planar arrangement of the P-type anode layer 30 and the guard ring layer 40 shown in FIG. 10. FIG. 11 is a schematic view illustrating the cross section along line D-D shown in FIG. 10.

As shown in FIG. 11, the semiconductor device 7 further includes a P-type contact layer 83. The P-type contact layer 83 is provided between the first region 31*a* of the P-type anode layer 30 and the anode electrode 60. The P-type contact layer 83 includes the P-type impurity having a higher concentration than the peak concentration of the P-type impurity in the first region 31*a* (referring to FIG. 3B). Thereby, an ohmic contact can be formed between the P-type contact layer 83 and the anode electrode 60. For example, the P-type contact layer 83 is formed so that the thickness in the Z-direction is thinner than the thickness in the Z-direction of the recess portion 31.

Figure 12:
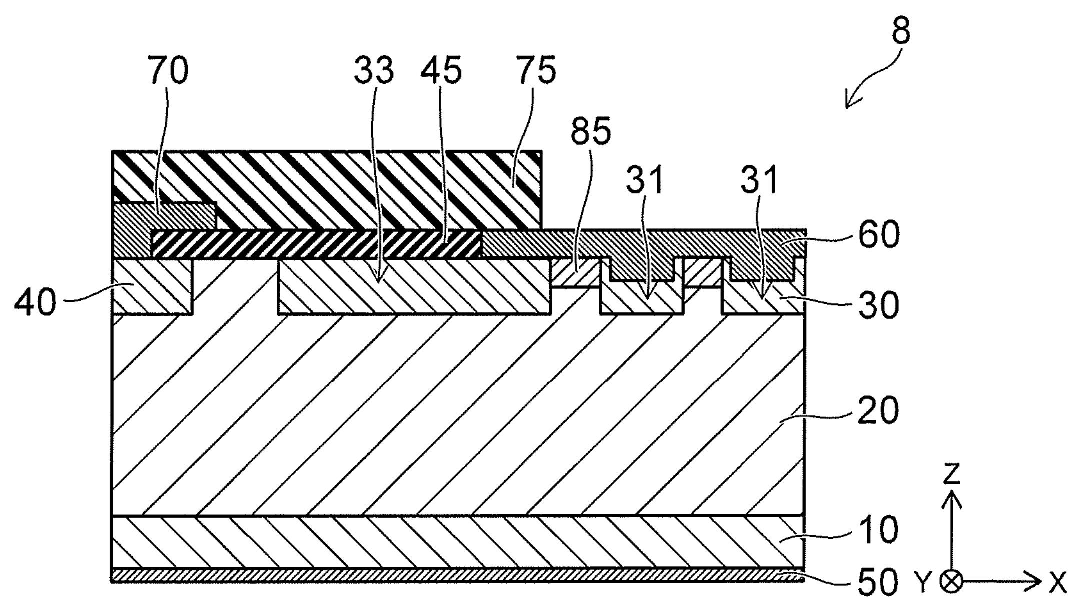
FIG. 12 is a schematic cross-sectional view showing a semiconductor device according to a second modification of the second embodiment.
Figure 13:
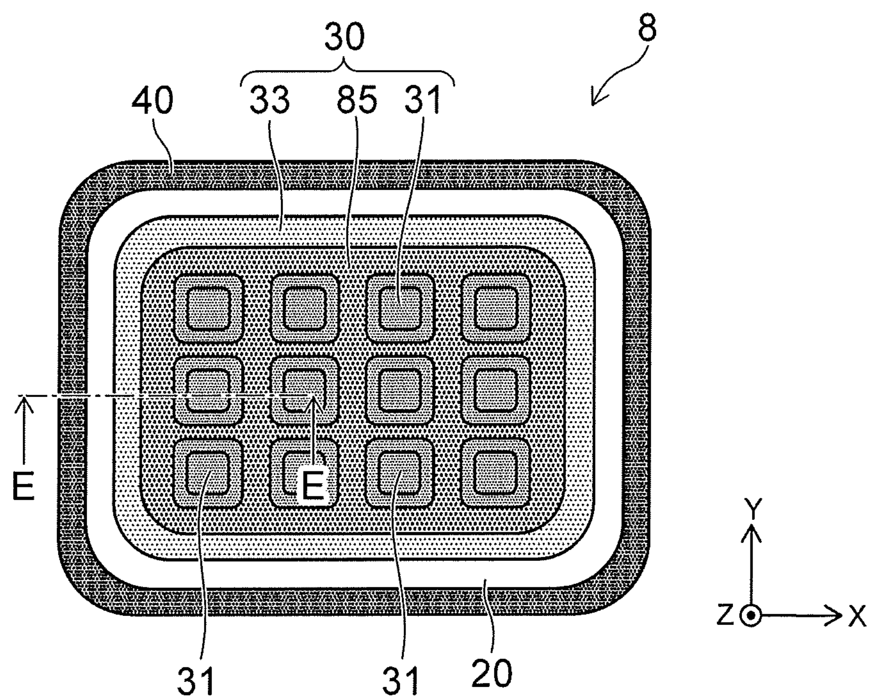
FIG. 13 is a schematic plan view showing the semiconductor device according to the second modification of the second embodiment.

FIG. 12 and FIG. 13 are schematic views showing a semiconductor device 8 according to a second modification of the second embodiment. FIG. 12 is a schematic view illustrating a cross section along line E-E shown in FIG. 13. FIG. 13 is a schematic plan view showing the arrangement of the P-type anode layer 30 and the guard ring layer 40 of the semiconductor device 8.

As shown in FIG. 12 and FIG. 13, the P-type anode layer 30 of the semiconductor device 8 includes the recess portion 31, the outer edge portion 33, and a low-concentration portion 85. The recess portion 31 is formed by selectively removing a portion of a P-type diffusion layer having substantially the same P-type impurity distribution as the outer edge portion 33. The low-concentration portion 85 includes the P-type impurity having a lower concentration than that of the recess portion 31.

As shown in FIG. 13, the recess portion 31 is disposed in an island configuration; and the low-concentration portion 85 is provided to surround the recess portion 31. The outer edge portion 33 is provided to surround the low-concentration portion 85. Also, the guard ring layer 40 is provided to surround the P-type anode layer 30.

In the embodiment as well, the outer edge portion 33 of the P-type anode layer 30 and the guard ring layer 40 have the P-type impurity distribution shown in FIG. 3A. Conversely, the recess portion 31 has the P-type impurity distribution shown in FIG. 3B. The P-type impurity distribution in the Z-direction at the boundary vicinity between the recess portion 31 and the I-layer 20 is substantially the same as the P-type impurity distribution in the Z-direction at the boundary vicinity between the outer edge portion 33 and the I-layer 20.

The low-concentration portion 85 has a P-type impurity distribution having a lower concentration than the P-type impurity distribution shown in FIG. 3B. Thereby, in the semiconductor device 8, the amount of holes injected into the I-layer 20 from the P-type anode layer 30 can be suppressed. Further, the amount of holes injected into the I-layer 20 can be corrected by controlling the recess amount LA of the recess portion 31 (referring to FIG. 3B).

Figure 14:
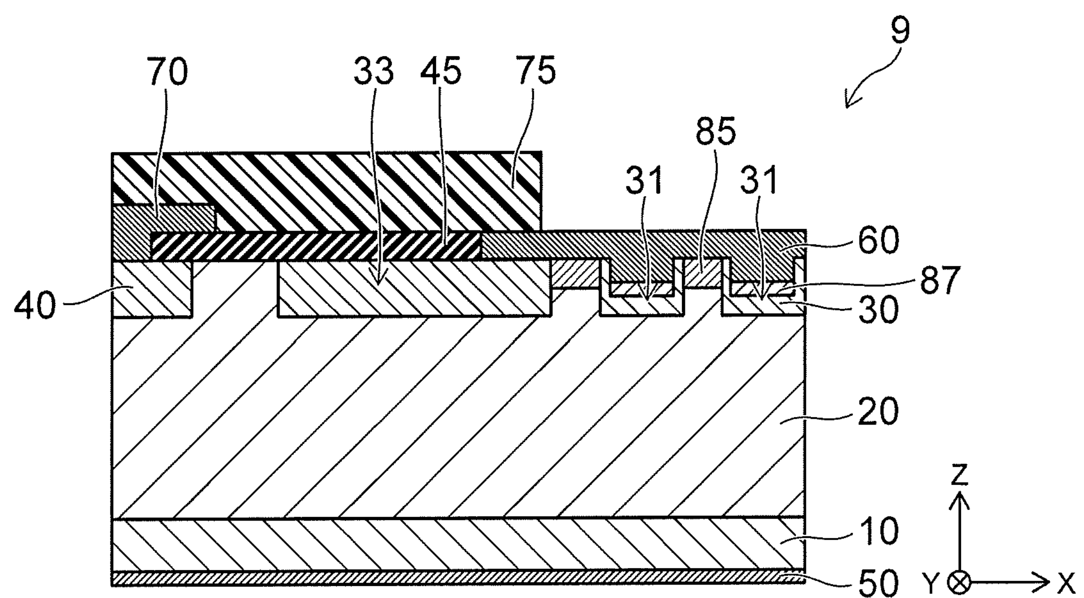
FIG. 14 is a schematic cross-sectional view showing a semiconductor device according to the third modification of the second embodiment.

FIG. 14 is a schematic cross-sectional view showing a semiconductor device 9 according to a third modification of the second embodiment. The semiconductor device 9 has the planar arrangement of the P-type anode layer 30 and the guard ring layer 40 shown in FIG. 13. FIG. 14 is a schematic view illustrating the cross section along line E-E shown in FIG. 13.

As shown in FIG. 14, the semiconductor device 9 further includes a P-type contact layer 87. The P-type contact layer 87 is provided between the recess portion 31 of the P-type anode layer 30 and the anode electrode 60. The P-type contact layer 87 includes the P-type impurity having a higher concentration than the peak concentration of the P-type impurity in the recess portion 31 (referring to FIG. 3B). Thereby, an ohmic contact can be formed between the P-type contact layer 87 and the anode electrode 60. For example, the P-type contact layer 87 is formed so that the thickness in the Z-direction is thinner than the thickness in the Z-direction of the recess portion 31.

In the embodiments recited above, by providing the recess portion 31 where a portion of the P-type diffusion layer included in the P-type anode layer 30 is selectively removed, the hole injection into the I-layer 20 is suppressed; and the switching speed from the ON-state to the OFF-state is increased. Simultaneously, the breakdown immunity of the terminal portion can be increased by forming the outer edge portion 33 of the P-type anode layer 30 and the guard ring layer 40 to have substantially the same P-type impurity distribution.

In the case where the contact resistance between the P-type anode layer 30 and the anode electrode 60 is increased by selectively removing the portion of the P-type diffusion layer, the contact resistance can be reduced by appropriately providing the P-type contact layers 35, 37, 39, 83, and 87 between the recess portion 31 and the anode electrode 60. Each P-type contact layer is formed by, for example, using the conditions of a low energy and a low dose in the ion implantation of the P-type impurity and by using heat treatment conditions at which the diffusion of the P-type impurity can be suppressed.

Although the semiconductor devices according to the first and second embodiments are described hereinabove, the embodiments are not limited thereto. For example, configurations may be used in which the conductivity types of the configurations recited above are reversed. Also, the planar arrangements of the P-type anode layer 30 and the guard ring layer 40 shown in FIG. 2, FIG. 7A, FIG. 7B, FIG. 10, and FIG. 13 are examples and are not limited thereto. For example, a configuration may be used in which the P-type anode layer 30 has multiple recess portions 31 formed in stripe configurations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:

a first semiconductor layer of a first conductivity type;

a second semiconductor layer of a second conductivity type provided on the first semiconductor layer, the second semiconductor layer including a recess portion and an outer edge portion, the recess portion being provided inside the second semiconductor layer, the outer edge portion surrounding the recess portion; and a third semiconductor layer of a second conductivity type provided on the first semiconductor layer, the third semiconductor layer being disposed to be away from the second semiconductor layer in a first direction directed along a first boundary between the first semiconductor layer and the recess portion of the second semiconductor layer, the second semiconductor layer having a first distribution of a second conductivity type impurity at a vicinity of the first boundary and a second distribution of a second conductivity type impurity at a vicinity of a second boundary between the outer edge portion of the second semiconductor layer and the first semiconductor layer, the first and second distributions being defined in a second direction crossing the first boundary, the first distribution being substantially same as the second distribution, the third semiconductor layer having a third distribution of a second conductivity type impurity at a vicinity of a third boundary between the first semiconductor layer and the third semiconductor layer, the third distribution being defined in the second direction and being substantially same as the second distribution.

2. The device according to claim 1, further comprising:

a first electrode electrically connected to the recess portion of the second semiconductor layer; and a contact layer provided between the recess portion and the first electrode, the contact layer including a second conductivity type impurity having a higher concentration than a concentration of a second conductivity type impurity in the recess portion.

3. The device according to claim 2, wherein the contact layer is provided in a plurality, the plurality of contact layers being provided along a boundary between the recess portion and the first electrode, and the plurality of contact layers are arranged to be away from each other.

4. The device according to claim 1, wherein the recess portion is provided in a plurality in the second semiconductor layer.

5. The device according to claim 4, further comprising a first electrode electrically connected to the plurality of recess portions, the first electrode being provided to cover a surface of the second semiconductor layer other than the outer edge portion.

6. The device according to claim 1, wherein the second semiconductor layer includes a protrusion surrounded with the recess portion, the protrusion having an island configuration.

7. The device according to claim 6, wherein the protrusion having the island configuration has an upper surface positioned at the same level as an upper surface of the outer edge portion.

8. The device according to claim 6, further comprising a first electrode covering the recess portion and the protrusion having the island configuration, the first electrode being electrically connected to the recess portion and the protrusion.

9. The device according to claim 8, further comprising a contact layer provided between the recess portion and the first electrode, the contact layer including a second conductivity type impurity having a higher concentration than a concentration of a second-conductivity-type impurity in the recess portion, the contact layer not being provided between the protrusion having the island configuration and the first electrode.

10. The device according to claim 2, further comprising:

a second electrode electrically connected to the first semiconductor layer; and a third electrode electrically connected to the third semiconductor layer, the second semiconductor layer and a portion of the first semiconductor layer being positioned between the first electrode and the second electrode, the third semiconductor layer and other portion of the first semiconductor layer being positioned between the third electrode and the second electrode.

11. The device according to claim 10, further comprising a fourth semiconductor layer of a first conductivity type provided between the first semiconductor layer and the second electrode, the fourth semiconductor layer including a first conductivity type impurity having a higher concentration than a concentration of a first conductivity type impurity in the first semiconductor layer, the second electrode being electrically connected to the fourth semiconductor layer, the first semiconductor layer being electrically connected to the second electrode via the fourth semiconductor layer.

12. A semiconductor device, comprising:

a first semiconductor layer of a first conductivity type; and a second semiconductor layer of a second conductivity type provided on the first semiconductor layer, the second semiconductor layer including a recess portion and an outer edge portion, the recess portion being provided inside the second semiconductor layer, the outer edge portion surrounding the recess portion, the recess portion including first and second portions contacting the first semiconductor layer, the second portion including a second conductivity type impurity having a lower concentration than a concentration of a second conductivity type impurity in the first portion, the first portion and the second portion being arranged along a first direction, the first direction being directed along a first boundary between the first semiconductor layer and the first portion, the second semiconductor layer having a first distribution of a second conductivity type impurity at a vicinity of the first boundary and a second distribution of a second conductivity type impurity at a vicinity of a second boundary between the outer edge portion of the second semiconductor layer and the first semiconductor layer, the first distribution and the second distribution being defined in a second direction crossing the first boundary, the first distribution being substantially same as the second distribution.

13. The device according to claim 12, further comprising:

a third semiconductor layer of a second conductivity type provided on the first semiconductor layer, the third semiconductor layer being disposed to be away from the second semiconductor layer in the first direction, the third semiconductor layer having a third distribution of a second conductivity type impurity at a vicinity of a third boundary between the first semiconductor layer and the third semiconductor layer, the third distribution being defined in the second direction and being substantially same as the second distribution of the second conductivity type impurity.

14. The device according to claim 12, further comprising:

a first electrode electrically connected to the recess portion; and a contact layer provided between the first portion of the recess portion and the first electrode, the contact layer including a second conductivity type impurity having a higher concentration than a concentration of a second conductivity type impurity in the first portion of the recess portion.

15. A semiconductor device, comprising:

a first semiconductor layer of a first conductivity type; and a second semiconductor layer of a second conductivity type provided on the first semiconductor layer, the second semiconductor layer including a first region, a second region adjacent to the first region, and an outer edge portion surrounding the first region and the second region, the first region and the second region being arranged in a first direction directed along a first boundary between the first semiconductor layer and the first region, the first region including a recess portion, the second region including a second conductivity type impurity having a lower concentration than a concentration of a second conductivity type impurity in the outer edge portion.

16. The device according to claim 15, wherein the second semiconductor layer having a first distribution of a second conductivity type impurity at a vicinity of the first boundary and a second distribution of a second conductivity type impurity at a vicinity of a second boundary between the outer edge portion and the first semiconductor layer, the first distribution and the second distribution being defined in a second direction crossing the first boundary, the first distribution being substantially same as the second distribution.

17. The device according to claim 16, further comprising:

a first electrode electrically connected to the first region and the second region; and a contact layer provided between the first electrode and the first region, the contact layer including a second conductivity type impurity having a higher concentration than a concentration of a second-conductivity-type impurity in the first region.

18. The device according to claim 16, further comprising a third semiconductor layer of a second conductivity type disposed to be away from the second semiconductor layer on the first semiconductor layer, the third semiconductor layer having a third distribution of a second conductivity type impurity at a vicinity of a third boundary between the first semiconductor layer and the third semiconductor layer, the third distribution being defined in the second direction and being substantially same as the second distribution.

* * * * *